United States Patent
Wienrich et al.

(10) Patent No.: US 7,199,304 B2
(45) Date of Patent: Apr. 3, 2007

(54) CONFIGURABLE MICROELECTRONIC PACKAGE USING ELECTRICALLY CONDUCTIVE MATERIAL

(75) Inventors: Jeff R. Wienrich, Gilbert, AZ (US); Joni G. Hansen, Phoenix, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 10/235,630

(22) Filed: Sep. 4, 2002

(65) Prior Publication Data

US 2004/0040741 A1 Mar. 4, 2004

(51) Int. Cl.
*H05K 1/00* (2006.01)
(52) U.S. Cl. .................... 174/254; 174/261
(58) Field of Classification Search ........... 174/254, 174/261
See application file for complete search history.

(56) References Cited

U.S. PATENT DOCUMENTS

| | | | | |
|---|---|---|---|---|
| 5,264,664 A | * | 11/1993 | McAllister et al. | 174/261 |
| 5,308,928 A | * | 5/1994 | Parla et al. | 174/261 |
| 5,455,760 A | * | 10/1995 | Bilas et al. | 700/22 |
| 6,274,824 B1 | * | 8/2001 | Rueda-Aguilocho et al. | 174/261 |
| 6,320,139 B1 | * | 11/2001 | Byle et al. | 174/261 |

* cited by examiner

*Primary Examiner*—Dean A. Reichard
*Assistant Examiner*—Jeremy C. Norris
(74) *Attorney, Agent, or Firm*—Schwabe, Williamson & Wyatt, P.C.

(57) ABSTRACT

Apparatus and methods are provided to enable circuit configuration of a substrate by the setting of settable bits associated with those circuits. An electrically conductive material is deposited onto selected settable bits which closes the desired circuit between the settable bits. In one embodiment in accordance with the invention, a carrier substrate is provided that comprises settable bits which are used to control a microelectronic package's electrical characteristics. In one embodiment, the settable bits are in the form of sets of spaced-apart bit pads which form an open circuit between a logic circuit and electrical ground (Vss). The open circuit is closed with the application of electrically conductive material that bridges the set of spaced-apart bit pads. The settable bits, therefore, do not require the addition of high profile components such as 0-ohm resisters to form the electrical bridging function between the bit pads of a settable bit. The settable bits provide a highly configurable control interface that allows the setting of one or more electrical characteristics. The settable bits are easily and quickly configurable and do not require complex customized machinery for implementation. Further, they do not significantly add to the cost of development or manufacture of the carrier substrate.

13 Claims, 4 Drawing Sheets

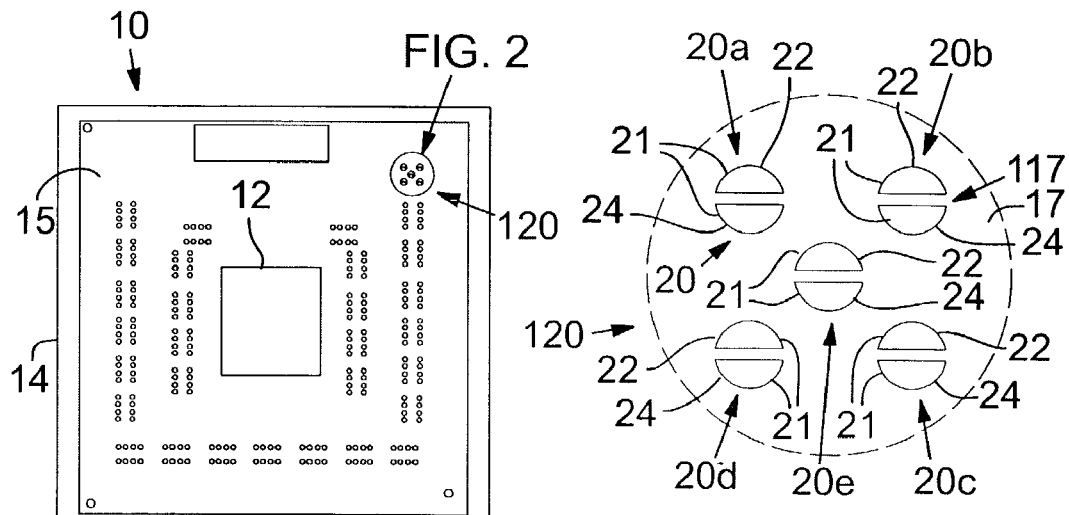
FIG. 1
FIG. 2
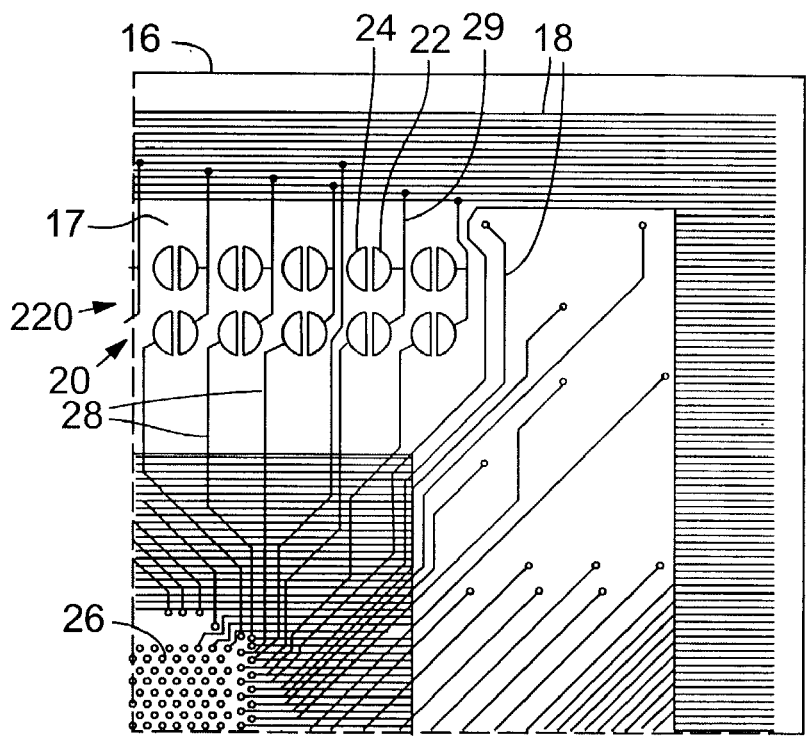
FIG. 3

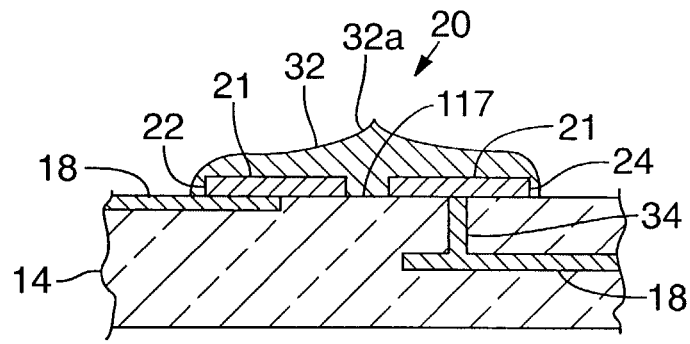
FIG. 4a
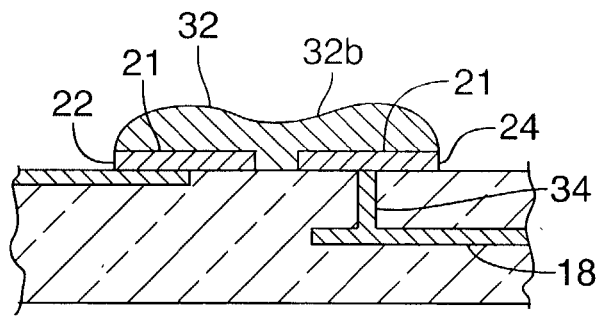
FIG. 4b
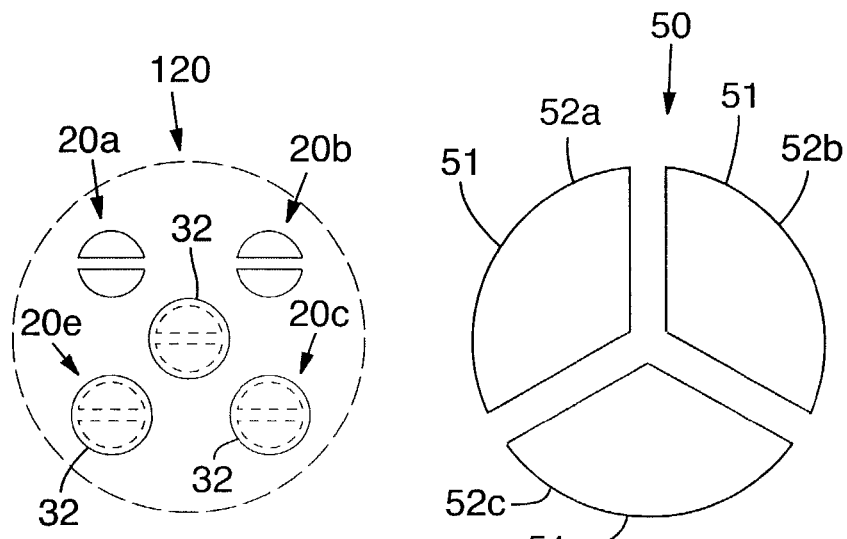
FIG. 6
FIG. 5

FIG. 7 providing at least one settable bit comprising a circuit bit pad in electrical communication with a circuit device and a ground bit pad in electrical communication with electrical ground, the circuit bit pad and the ground bit pad being electrically separated by a gap — 701 leaving the at least one settable bit in an electrically open state providing a binary one (1) to the circuit device or depositing an electrically conductive material on the at least one settable bit electrically interconnecting the circuit bit pad and the ground bit pad across the gap providing a binary zero (0) to the circuit device, wherein an open or closed electrical state of the at least one settable bit controls an encoded signal to the circuit device — 702 selecting an electrically conductive material from the group consisting of lead-free solder and solder paste, and solder and solder paste comprising lead — 703 exposing the electrically conductive material to reflow conditions — 704 selecting an electrically conductive material comprising electrically conductive adhesive and curing the adhesive — 705 providing the circuit bit pad in electrical communication with a voltage regulator circuit, and wherein the encoded signal provides voltage ID — 706 providing the circuit bit pad in electrical communication with a frequency regulator circuit, and wherein the encoded signal provides Front Side Bus settings — 707

FIG. 8

```
providing at least one settable bit on a surface of a carrier substrate, the at least
one settable bit comprising a circuit bit pad in electrical communication with a
circuit device and a ground bit pad in electrical communication with electrical ground,
the circuit bit pad and the ground bit pad being electrically separated by a gap
```
↓ 801

```
leaving the at least one settable bit in an electrically open state providing a
binary one (1) to the circuit device or depositing an electrically conductive
material on the at least one settable bit electrically interconnecting the
circuit bit pad and the ground bit pad across the gap providing a binary
zero (0) to the circuit device, wherein the open or closed electrical state
of the at least one settable bit controls an encoded signal to the circuit device
```
↓ 802

```
selecting an electrically conductive material from the
group consisting of lead-free solder and solder paste,
and solder and solder paste comprising lead
```
803

```
exposing the electrically conductive material to reflow conditions
```
804   805

```
selecting an electrically conductive material comprising
electrically conductive adhesive and curing the adhesive
```

806

```
providing the circuit bit pad in electrical communication with a voltage
regulator circuit, and wherein the encoded signal provides voltage ID
```

807

```
providing the circuit bit pad in electrical communication
with a frequency regulator circuit, and wherein the
encoded signal provides Front Side Bus settings
```

CONFIGURABLE MICROELECTRONIC PACKAGE USING ELECTRICALLY CONDUCTIVE MATERIAL

FIELD OF THE INVENTION

The present invention relates to microelectronic packaging and, more particularly, to a configurable carrier substrate and method for setting the electrical characteristics of the microelectronic package during package assembly.

BACKGROUND OF INVENTION

A microelectronic package comprises a microelectronic die electrically interconnected with a carrier substrate, and one or more other elements, such as electrical interconnects, a die lid, a heat dissipation device, among others. An example of a microelectronic package is an integrated circuit microprocessor. A microelectronic die comprises multiple interconnected microcircuits within a single carrier to perform electronic circuit functions. A microelectronic device is defined as a microelectronic die with microcircuits electrically interconnected with electrically conductive pathways on the surface of or within a carrier substrate. Electrical communication between the microcircuits and external components may be provided by electrically interconnecting the electrically conductive pathways of the carrier substrate with electrically conductive pathways of a system substrate. An example of a system substrate is a printed circuit board (PCB), which, in some applications, is referred to as a motherboard.

Microelectronic packages are designed to have specific electrical characteristics specified by the desired operating characteristics of the attached microelectronic die and the specific application where the microelectronic package is to be used. Some of these electrical characteristics include operating voltage and frequency. The production costs to produce individual microelectronic package designs for each of the desired electrical characteristics for each of the ever-evolving microelectronic dice is prohibitive. Therefore, microelectronic packages are commonly designed to be used for many different applications by providing some degree of control over setting the desirable electrical characteristics of the microelectronic device.

For example, a microelectronic package in the form of an integrated circuit microprocessor might be adapted to be used in a desktop as well as a laptop computer application. For optimum performance, each application might require the microelectronic package to operate with different die core voltage and Front Side Bus (FSB) frequency values. Therefore the microelectronic device is engineered to provide the ability to control or set these values for a particular application during manufacture and assembly of the microelectronic package.

A common method to control the electrical characteristics of the microelectronic package involves the use of settable bits. Settable bits can be thought of as micro-switches that are either open or closed used to control a logic circuit using one or more on/off signals. The on/off signals are interpreted by the logic circuit to cause the microelectronic device to operate with the desired electrical characteristics. For example, one settable bit has two possible electrical states; one on or open and one off or closed. Therefore, the logic circuit may control the microelectronic device to operate with one of two possible electrical characteristics. Two settable bits will have four possible electrical states which may control the microelectronic device to operate with one of four possible electrical characteristics, and so forth.

In one example illustrating the setting of the die core voltage using settable bits on the carrier substrate of the microelectronic package, the carrier substrate is engineered to provide one or more pairs of open circuit electrical contacts known as voltage identification (voltage ID or VID) bits. One electrical contact of each pair is coupled to electrical ground (Vss) while the other electrical contact is connected to a voltage regulator circuit (VRC). A VID bit is closed by soldering a 0-ohm resistor across the pair of electrical contacts electrically shorting the circuit. A closed bit is interpreted by the VRC to be a logical or binary zero ("0"). A VID bit in its open state is interpreted to be a logical or binary one ("1").

The electrical state of the VID bits is interpreted by the VRC, which responds with a predetermined voltage value. The VRC response to the electrical state of the VID bits is predetermined by the microelectronic device's design or programming. In a four (4) bit configuration, up to sixteen (2.super.4) possible VID bit combinations can be used to set different VRC responses.

The ongoing goals of the computer industry are toward higher performance, lower cost and increased miniaturization of microelectronic packaging. The use of 0-ohm resistors coupled to electrical contacts on the carrier substrate does not lend itself to current and future packaging performance goals. The resistors are inherently bulky taking up valuable real estate and volume that interferes with achieving the goal of microelectronic package miniaturization. Applying the resistors across the pairs of contacts requires accurate placement by complex production equipment on a surface of the carrier substrate otherwise crowded with other connectors and components.

New configurations and methods are needed for providing settable bits on the carrier substrate to control the microelectronic package's electrical characteristics. They must provide for exceptionally small scale integration, not interfere with the electrical interface of other components within the microelectronic package, be highly configurable to provide for many control variations, easily and quickly configurable without the need for complex machinery, and inexpensive to manufacture.

BRIEF DESCRIPTION OF DRAWINGS

FIG. 1 is a top view of a microelectronic device in accordance with an embodiment of the invention;

FIG. 2 is a top view of a five-bit array of settable bits in accordance with an embodiment of the invention;

FIG. 3 is a top view of a printed circuit layer in accordance with an embodiment of the invention;

FIG. 4*a* is a cross-sectional view of the carrier substrate in accordance with an embodiment of the invention with electrically conductive material deposited onto the two bit pads and bridging the separation;

FIG. 4*b* is a cross-sectional view of the carrier substrate in accordance with an embodiment of the invention with post reflow solder paste;

FIG. 5 is a top view of an embodiment of a tri-segmented settable bit in the form of a disk that is segmented into three circular bit pads in accordance with an embodiment of the invention;

FIG. 6 is a top view of a 5-settable bit array comprising five settable bits in accordance with an embodiment of the invention;

FIG. 7 is a flow chart of methods for controlling an encoded signal to a circuit device in accordance with embodiments of the invention; and FIG. 8 is a flow chart of selected methods for manufacturing and setting the electrical state of a microelectronic device by controlling an encoded signal to a circuit device, in accordance with embodiments of the invention.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

A carrier substrate is provided that comprises settable bits that are used to control the microelectronic package's electrical characteristics. The settable bits are in the form of sets of spaced-apart bit pads that form an open circuit. The open circuit is closed with the application of electrically conductive material that bridges two or more bit pads of the set.

FIG. 1 is a top view of a microelectronic device 10 in accordance with an embodiment of the invention. The microelectronic device 10 comprises a microelectronic die 12 (illustrated as a flip-chip, but not limited thereto) electrically interconnected with a carrier substrate 14 adjacent the carrier substrate's top surface 15.

The carrier substrate 14 comprises one or more printed circuit layers 16. FIG. 3 is a top view of a printed circuit layer 16 in accordance with an embodiment of the invention. The printed circuit layers 16 comprise a plurality of electrically conductive traces 18 disposed on a dielectric layer 17. The electrically conductive traces 18 form a number of circuit paths 28 to enable electrical communication with various components.

The plurality of electrically conductive traces 18 are formed by any technique known in the art, including but not limited to photolithographic and silkscreen techniques. One exemplary photolithographic technique involves forming a conformal layer of electrically conductive material over the dielectric layer and applying a photoresist layer over the electrically conductive material layer. The photoresist layer is photoactive, such that when exposed to light (usually ultraviolet light), the photoresist either becomes soluble (positive photoresist) or insoluble (negative photoresist) in specific solvents. Light is projected through a template that shields specific areas of the photoresist while exposing other areas, thereby translating the pattern of the template onto the photoresist. After exposure, an appropriate solvent removes the desired portions of the photoresist. The remaining photoresist becomes a mask that remains on the electrically conductive material layer. The mask is used to expose areas of the electrically conductive material layer to be etched away while protecting the electrically conductive material that ultimately forms the electrically conductive traces 18.

Interlayer interconnects are used to electrically interconnect electrically conductive traces 18 of more than one printed circuit layers 16. FIG. 4 shows a cross-sectional view of a via 34 which is one type, among others, of an interlayer interconnect. Vias 34 are electrically conductive conduits that extend through one or more printed circuit layers 16. The vias 34 are formed by any method known in the art, including but not limited to the laser drilling of bore holes that are plated with an electrically conductive material.

A predetermined number of circuit paths are provided with a discontinuity, that is, the circuit remains open due to a break in the electrically conductive trace 18, a gap between two vias 34, or a via 34 and an electrically conductive trace 18. Bit pads 21 are provided on both sides of the discontinuity and in electrical communication with their respective electrically conductive trace 18 or via 34. The bit pads 21 provide a feature onto which electrically conductive material, such as solder or electrically conductive adhesive, is deposited to electrically interconnect the bit pads 21, and therefore, close the discontinuity. A set of bit pads 21 is defined as a settable bit 20.

The bit pads 21 cam be formed by a number of processes known in the art. In a method in accordance with and embodiment of the invention, the bit pads 21 comprise the same material and are formed during the same process as the electrically conductive traces 18. In another method, the bit pads 21 comprise electrically conductive material, such as gold, silver, and copper, among others, which is deposited onto the dielectric layer17, and in contact with the electrically conductive traces 18 and/or vias 34, in a separate process known in the art, including but not limited to photolithographic and silkscreen techniques.

In the embodiments of FIGS. 1–3 showing multiple settable bits 20 on the top surface 15 of a carrier substrate 14, each settable bit 20 comprises two bit pads 21, one of which is defined as a circuit bit pad 24 and the other a ground bit pad 22. The bit pads 21 are in close proximity to each other but electrically isolated from each other on the dielectric material 17 separated by a single substantially linear gap. Each circuit bit pad 24 is in electrical communication with an electrical component or circuit through a circuit path 28 and each ground bit pad 22 is in electrical communication with electrical ground (Vss) through a ground path 29.

The number and arrangement of the settable bits 20 on the carrier substrate 10 is predetermined for a particular purpose, and may be dictated in accordance with the available surface area on the top surface 15 of the carrier substrate 10 and the number of bit-controlled electrical parameters that are desired. In accordance with an embodiment of the present invention, the settable bits 20 are arranged in a five-bit array 120 as shown in FIGS. 1 and 2. The five settable bits 20 are shown arranged in a configuration approximating a circle that is particularly surface-area efficient. In another embodiment, as shown in FIG. 3, the settable bits 20 are arranged in a ten-bit array 220 comprising two parallel rows of five settable bits 20.

The settable bit 20 is electrically closed with the deposition of electrically conductive material 32 onto the two bit pads 21 and across the separation 117 between the two bit pads 21. FIG. 4a is a cross-sectional view of the carrier substrate 14 with electrically conductive material 32 deposited onto the two bit pads 21 and bridging the separation 117. The separation 117, in this case, being a single substantially linear gap that directly separates the two bid pads 21. The electrically conductive material 32 electrically interconnects the two bit pads 21, closing or shorting the circuit. The bit pads 21 are in close proximity to each other, such that a bead of electrically conductive material 32 of sufficient but small size will electrically interconnect the bit pads 21. The bit pads 21 are very small, and, in one embodiment, the size is on the scale of 0.6 mm. Examples of suitable electrically conductive material 32 known in the art include, but are not limited to, electrically conductive adhesive and solder.

Methods of applying electrically conductive adhesive and solder that is in a semi-solid state are known in the art, such as, but not limited to, screen-printing and extrusion through a needle. Methods of applying electrically conductive adhesive and solder that is in a solid state are also known in the art, such as, but not limited to, placement by pick-and-place equipment.

In accordance with an embodiment of the present invention, electrically conductive adhesive is used as the electrically conductive material 32 to interconnect the bit pads 21 of a settable bit 20. Electrically conductive adhesives are readily available, such as silver-loaded epoxy, that provides an interconnect material that does not necessarily require a high temperature curing process. Electrically conductive adhesives can be deposited onto the settable bit 20 in many ways known in the art, including but not limited to, as a viscous fluid through a needle of needle-type dispensing equipment and through a screen of screen printing equipment.

FIG. 4a shows a cross-sectional view of electrically conductive adhesive 32a deposited on the bit pads 21 and the single substantially linear gap separation 117 between the bit pads 21, in accordance with an embodiment of the present invention. After application, the electrically conductive adhesive 32a is cured. Curing techniques are dependent on the electrically conductive adhesive 32a used and include, but not limited to, air drying, ultraviolet exposure, elevated temperature exposure, and self hardening.

In accordance with another embodiment of the present invention, solder is used as the electrically conductive material 32 to interconnect the bit pads 21 of a settable bit 20. Both leaded and lead-free solder can be utilized. Solder can be deposited onto the settable bit 20 in many ways known in the art, including but not limited to, through a needle in a molten state, through a screener in a semi-solid or paste state, or by pick-and-place equipment in a solid state.

In accordance with another embodiment of the present invention, solder paste is deposited on the bit pads 21 and the space between the bit pads 21. To effect a proper electrical interconnection, the solder paste is exposed to solder reflow conditions known in the art. The solder paste can be reflowed during the same reflow process in which the microelectronic die 12 is interconnected with the carrier substrate 10 or in a separate process. During the reflow process, the solder paste will melt and form a unitary electrical interconnection between the bit pads 21.

FIG. 4b is a cross-sectional view of the carrier substrate 14 with post reflow solder paste 32b. The shape of the post reflow solder paste 32b is dependent on a number of factors known in the art, such as, but not limited to, the surface tension of the bit pads 21 and dielectric material 17. It has been found that the post reflow solder paste 32b will tend to flow toward the bit pads 21 and away from the dielectric material 17 in the separation 117 between the bit pads 21, forming a "bow-tie" shape. This phenomena can possibly result in the post reflow solder paste 32b pulling away from and not covering the dielectric material 17 in the separation 117 between the bit pads 21. Therefore, a sufficient amount of solder paste is necessary to ensure that sufficient post reflow solder paste 32b remains in the separation 117.

The reflow conditions for the solder paste 32b are predicated on whether the bit pads 21 are interconnected before, during, or after the interconnection of the microelectronic die 12 to the carrier substrate 10 and whether the solder paste 32b requires has a higher, lower, or equal reflow temperature as the interconnect material interconnecting the microelectronic die 12 to carrier substrate 10. For example, it can be understood that if a higher temperature reflow process is required for the solder paste 32b, the process may have a detrimental effect on a lower temperature interconnect material used to previously interconnect the microelectronic die 12 and the carrier substrate 10.

Each settable bit 20 comprises two or more bit pads 21 that are electrically separated a predetermined distance. The specific configuration of the settable bits 20 and the bit pads 21 that make up the settable bit 20 can vary. In accordance with an embodiment of the present invention, a settable bit 20 having two bit pads 21 is configured as a segmented disk, forming two separated half circles of predetermined size, such as those shown in FIGS. 2 and 3.

In an embodiment, the settable bit 20 has an overall diameter of 0.60 mm, and a separation 117 between the bit pads 21 of 0.10 mm. Each settable bit 20 is spaced a distance of 1.35 mm on center from another settable bit 20. Settable bits 20 of this scale are especially desirable in achieving the goal of reducing overall microelectronic package size.

The settable bit 20 having an overall circular shape is especially efficient in terms of applying or dispensing the electrically conductive material 32 to interconnect the two half circles, as a drop from a dispenser will naturally take the form of a circle. Other bit pad 21 shapes will work as well, such as variations of circles, rectangles, squares and triangles.

In accordance with other embodiments of the present invention, the settable bit 20 comprises more than two bit pads 21. FIG. 5 is a top view of an embodiment of a tri-segmented settable bit 50 in the form of a disk that is segmented into three circular bit pads 51. Settable bits 20 having 2 or more bit pads 21 can be useful for, but not limited to, multiple signal and voltage level settings as well as for connecting one circuit to another circuit. It is understood that beyond the settable bit 20 having two bit pads 21, the dispensing of the electrically conductive material 32 becomes more complex to ensure accuracy of placement and sufficient coverage. In various embodiments, the bit pads 51 may each be substantially equal-sized portions that when combined form a disk shape.

Settable bits 20 in the form of a break in the electrically conductive trace 18 without bit pads 21 can be used for much the same purpose. The advantages of the use of bit pads 21 includes, but not limited to, an increased surface area to interconnect with the electrically conductive material 32, the use of different materials for the bit pad 21 than for the electrically conductive traces 18, and increased robustness and strength of the interconnection.

Since the settable bits 20 are on the surface 17 of the carrier substrate 10, visual inspection of the microelectronic package enables one to determine the settings of the settable bits 20 during or after manufacture and assembly. In some cases, wherein the microelectronic package comprises a lid covering the microelectronic die 12 and a portion of the carrier substrate 10, the lid may need to be removed for visual inspection of the settable bits 20 if the settable bits 20 are located under the lid. In practice, the settable bits 20 will generally be placed outside of the die 12 area and visible without the need for disassembly of the microelectronic package.

In accordance with an embodiment of the present invention, the electrical state of settable bits 20 comprising two bit pads 21 is used to control various electrical components in accordance to whether the circuit remains open or is closed. For example, one bit pad 21 is defined as the circuit bit pad 24 which is electrically connected to a logic circuit via the circuit path 28. The second bit pad 21 is defined as the ground bit pad 22 which is electrically connected to electrical ground (Vss). The settable bits 20 provide the logic circuit with a combination of open and closed electrical states which is interpreted by the logic circuit to provide a desired condition or output.

The settable bits 20 provide a logical or binary one ("1") in their electrically open state. A settable bit 20 is configured to logical or binary zero ("0") by electrically interconnecting the circuit bit pad 24 and the ground bit pad 22, thereby closing the circuit. FIG. 6 is a top view of a 5-settable bit array 120 comprising five settable bits 20a–20e. Three settable bits 20c,d,e have been electrically interconnected by the application of electrically conductive material 32, effectively shorting the circuit. Two settable bits 20a,b are electrically open. Each settable bit 20a–20e is in an electrical state of either open or closed. Therefore, the 5-settable bit array 120 provides 32 (2.super.5) possible electrical state combinations, and therefore the logic circuit could be controlled to produce one of 32 settings.

Referring again to FIG. 5, an embodiment wherein each settable bit 50 comprises three bit pads 51, a first bit pad 52a is interconnected with the logic circuit and with either a second bit pad 52b that is interconnected with ground, or a third bit pad 52c that is interconnected with power, or left open. Such an arrangement would be useful in applications wherein a logic circuit can be programmed to respond to three electrical states: open, shorted (closed), and power.

In accordance with an embodiment of the present invention, the electrical state of settable bits 20 is used to provide the Voltage ID (VID) information needed to drive a voltage regulator circuit (VRC) to the correct voltage output for a microelectronic package. The VRC can take many forms known in the art, such as but not limited to a voltage regulator built into a system substrate and a voltage regulator module (VRM) which is a small replaceable module that installs on the system substrate such as a motherboard.

The VRC response to the electrical state of the settable bits 20 is a predetermined set of values defined by the VRC or other electrical component. Each settable bit 20 comprises two bit pads 21 consisting of a circuit bit pad 24 electrically interconnected with the VRC via the circuit path 28 and a ground bit pad 22 electrically connected to electrical ground (Vss). The settable bits 20 provide the VRC with a combination of open and closed electrical states configured during manufacturing and assembly.

Similarly, in accordance with an embodiment of the present invention, the settable bits 20 provide Front Side Bus (FSB) frequency settings. The FSB frequency, sometimes referred to as clock speed, is the number of pulses per second of a timing oscillator that controls the processing speed of the microelectronic die 12. The circuit bit pads 24 are electrically interconnected to a FSB frequency regulator circuit (FRC). The FRC interprets the open or closed electrical state of the settable bits 20 and provides the frequency in accordance with a predetermined value.

It is understood that the settable bits 20 can be electrically interconnected to one or more types of circuits that have the ability to be controlled by logic input. In accordance with an embodiment of the present invention, one or more settable bits 20 provide VID settings and one or more settable bits 20 provide FSB settings on the same carrier substrate 14.

It is further understood that the method of bridging open electrical circuits with electrically conductive material, as is done with the settable bits 20, can also be used in a number of different ways. In an embodiment in accordance with the invention, the carrier substrate 10 comprises a number of different circuit routings to accommodate the integration of different microelectronic dice 12. A settable bit is used to close or "activate" a particular circuit path useful for a particular die, leaving other circuit paths open and out of the overall circuit.

In another embodiment in accordance with the invention, the settable bits 20 are located on a system substrate and are used to configure various circuits associated with the system substrate and the electronic system as a whole. For example, one system substrate is comprised of a plurality of circuits broken by a settable bit 20 which are configured in a number of ways by selectively leaving open or closing the circuits. In this way, one system substrate can be provided that is useful for many electrical configurations.

A method of configuring product settings, including voltage identification (VID) and Front Side Bus (FSB) ratio selection, during microelectronic package assembly process rather than through custom microelectronic package designs for each product setting, is provided. This method uses a universal carrier substrate that is designed to a normally open (i.e. floating or logic 1) condition for each settable bit that needs a final re-configuration during manufacture or assembly. Such a settable bit is provided with a bit pad that is exposed to the surface of the substrate and is in proximity to another bit pad that is connected to the ground level. Thus each of the settable bits is designed with a pair of such bit pads. If a bit is to be grounded (i.e. set to logic 0), then its bit pad pair is bridged together by depositing electrically conductive epoxy or solder paste and followed by appropriate post processing such as cure or reflow. Those bits that are to be set to logic 1 are left open.

FIG. 7 is a flow chart of methods for controlling an encoded signal to a circuit device in accordance with embodiments of the invention. The methods for controlling an encoded signal to a circuit device in accordance with embodiments of the invention, are not limited to those given here. One skilled in the art will appreciate that there are other methods for practicing the invention.

A first method for controlling an encoded signal to a circuit device in accordance with embodiments of the invention, comprises providing at least one settable bit comprising a circuit bit pad in electrical communication with a circuit device and a ground bit pad in electrical communication with electrical ground, the circuit bit pad and the ground bit pad being electrically separated by a gap 701, leaving the at least one settable bit in an electrically open state providing a binary one (1) to the circuit device or depositing an electrically conductive material on the at least one settable bit electrically interconnecting the circuit bit pad and the ground bit pad across the gap providing a binary zero (0) to the circuit device, wherein an open or closed electrical state of the at least one settable bit controls an encoded signal to the circuit device 702.

A second method for controlling an encoded signal to a circuit device in accordance with an embodiment of the invention comprises selecting an electrically conductive material from the group consisting of lead-free solder and solder paste, and solder and solder paste comprising lead 703, and exposing the electrically conductive material to reflow conditions 704 in the first method.

A third method for controlling an encoded signal to a circuit device in accordance with an embodiment of the invention, comprises providing at least one settable bit comprising a circuit bit pad in electrical communication with a circuit device and a ground bit pad in electrical communication with electrical ground, the circuit bit pad and the ground bit pad being electrically separated by a gap

701, leaving the at least one settable bit in an electrically open state providing a binary one (1) to the circuit device or depositing an electrically conductive material on the at least one settable bit electrically interconnecting the circuit bit pad and the ground bit pad across the gap providing a binary zero (0) to the circuit device, wherein an open or closed electrical state of the at least one settable bit controls an encoded signal to the circuit device 702, selecting an electrically conductive material comprising electrically conductive adhesive and curing the adhesive 705.

A fourth method for controlling an encoded signal to a circuit device in accordance with an embodiment of the invention comprises providing the circuit bit pad in electrical communication with a voltage regulator circuit, and wherein the encoded signal provides voltage ID 706 to either the first, second or third method.

A fifth method for controlling an encoded signal to a circuit device in accordance with an embodiment of the invention comprises providing the circuit bit pad in electrical communication with a frequency regulator circuit, and wherein the encoded signal provides Front Side Bus settings 708 to either the first, second or third method.

FIG. 8 is a flow chart of selected methods for manufacturing and setting the electrical state of a microelectronic device by controlling an encoded signal to a circuit device, in accordance with embodiments of the invention. The methods for manufacturing and setting the electrical state of a microelectronic device by controlling an encoded signal to a circuit device, in accordance with embodiments of the invention, are not limited to those given here. One skilled in the art will appreciate that there are other methods for practicing the invention.

A first method for manufacturing and setting the electrical state of a microelectronic device by controlling an encoded signal to a circuit device, in accordance with embodiments of the invention, comprises providing at least one settable bit on a surface of a carrier substrate, the at least one settable bit comprising a circuit bit pad in electrical communication with a circuit device and a ground bit pad in electrical communication with electrical ground, the circuit bit pad and the ground bit pad being electrically separated by a gap 801, and leaving the settable bit in an electrically open state providing a binary one (1) to the circuit device or depositing an electrically conductive material on the at least one settable bit electrically interconnecting the circuit bit pad and the ground bit pad across the gap providing a binary zero (0) to the circuit device, wherein the open or closed electrical state of the at least one settable bit controls an encoded signal to the circuit device 802.

A second method for manufacturing and setting the electrical state of a microelectronic device by controlling an encoded signal to a circuit device in accordance with an embodiment of the invention comprises selecting an electrically conductive material from the group consisting of lead-free solder and solder paste, and solder and solder paste comprising lead 803, and exposing the electrically conductive material to reflow conditions 804 in the first method.

A third method for manufacturing and setting the electrical state of a microelectronic device by controlling an encoded signal to a circuit device in accordance with an embodiment of the invention, comprises providing at least one settable bit comprising a circuit bit pad in electrical communication with a circuit device and a ground bit pad in electrical communication with electrical ground, the circuit bit pad and the ground bit pad being electrically separated by a gap 701, leaving the at least one settable bit in an electrically open state providing a binary one (1) to the circuit device or depositing an electrically conductive material on the at least one settable bit electrically interconnecting the circuit bit pad and the ground bit pad across the gap providing a binary zero (0) to the circuit device, wherein an open or closed electrical state of the at least one settable bit controls an encoded signal to the circuit device 802, selecting an electrically conductive material comprising electrically conductive adhesive and curing the adhesive 805.

A fourth method for manufacturing and setting the electrical state of a microelectronic device by controlling an encoded signal to a circuit device in accordance with an embodiment of the invention comprises providing the circuit bit pad in electrical communication with a voltage regulator circuit, and wherein the encoded signal provides voltage ID 806 to either the first, second or third method.

A fifth method for manufacturing and setting the electrical state of a microelectronic device by controlling an encoded signal to a circuit device in accordance with an embodiment of the invention comprises providing the circuit bit pad in electrical communication with a frequency regulator circuit, and wherein the encoded signal provides Front Side Bus settings 808 to either the first, second or third method.

The small scale of the settable bits provided by embodiments of the invention reduces signal routing congestion at the critical die escape area, i.e. near the edge of the microelectronic die. Thus, embodiments of the invention can prevent microelectronic die size growth (in bond pad limited die designs) and/or package layer count reduction (IO density limited package designs).

Validation Testing

A number of successful validation experiments were performed to demonstrate the effectiveness of various embodiments of the invention. The experiments involved the application of electrically conductive material 32 in the form of electrically conductive epoxy and solder paste. In both cases, an Asymtek Century™ 718-SMT equipped with a DV-7000 Heli-flow™ dispensing system was used to dispense 0.7 mm (0.025-inch) diameter dots of electrically conductive epoxy and solder paste on 0.60 mm (0.022-inch) diameter settable bits 20 on a number of carrier substrates 10. The dispense location on the carrier substrates 10 was the bottom three of the five settable bits 20, as shown in FIG. 6, located in the upper right hand corner of the carrier substrate 10, as shown in FIG. 1.

Ablebond 84-1LMI-SR4 silver-filled, heat curable electrically conductive epoxy, known in the art, was used in the test to validate the use of an electrically conductive adhesive. The 0.70 mm (0.025-inch) diameter dots of silver epoxy deposited on the settable bits 20 had a volume of $2.04 \times 10^{-4}$ cc. The silver epoxy was cured using the manufacturer recommendations of 1 hour @ 150° C.

The epoxy dot size was achieved by optimizing the valve speed in relation to the valve on time, fluid pressure, retract parameters, dwell time, and the needle specifications. The DV-7000 Heli-flow™ was fitted with a 23-gage needle with a 0.006-inch standoff. The standoff increases dot repeatability by creating a fixed dispense height. A consistent dot diameter of 0.70 mm (0.025-inch) was obtainable without excessive material tailing. The concern of an epoxy tail falling onto another settable bit 31 and creating an electrical short is reason for minimizing the tail height.

Indium 84% metal solder paste, known in the art, was used in validating the use of solder paste. The properties of the Indium solder paste is as follows: Flux NC-SMQ90; Alloy Type SN63-PB37; Powder Mesh Size–500/+635; Metal Content 84%; and IPN 82597. The 0.70 mm (0.025- inch) dot diameter of solder paste deposited on the settable bits 20 had a volume of $2.89\times10^{-4}$ cc.

The deposited solder paste was exposed to reflow conditions over a 6 minute period, with a maximum temperature of 209.degrees.C., with a total time above the melting temperature of 164.degrees.C. of approximately 2 minutes. In some cases, the molten solder paste exhibited preferential wetting to one side of the semi-circle gold bit pads 21, resulting in a less than uniform coverage over the settable bit 20. Through experimentation, a sufficient amount of solder paste was found for the particular reflow conditions to properly electrically close the circuit.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method, comprising:
    providing a settable bit on a carrier substrate having a conductive trace, the settable bit including at least a first, a second, and a third bit pads, the first bit pad adapted to be in electrical communication with a circuit device through the conductive trace, the second bit pad to provide a first electrical state, and the third bit pad to provide a second electrical state, the first, the second, and the third bit pads being electrically separated; and
    selectively setting the settable bit to provide one of at least three electrical states to the circuit device, the selective setting including either
        configuring the settable bit by depositing an electrically conductive material between the first and the second bit pads electrically coupling the first and second bit pads to provide the first electrical state,
        configuring the settable bit by depositing an electrically conductive material between the first and the third bit pads to provide the second electrical state, or
        configuring the settable bit by electrically isolating the first bit pad from the second and third bit pads to provide a third electrical state; and
    wherein said providing comprises providing a settable bit including at least a first, a second, and a third bit pad that are configured on the carrier substrate to form a disk shape; and
    wherein said providing comprises providing a settable bit including at least a first, a second, and a third bit pads, each of the first, the second, and the third bit pads being same type of bit pads of substantially equal-sized portions that when combined form a disk.

2. The method of claim 1, wherein said providing comprises providing a settable bit including a second bit pad adapted to be in electrical communication with electrical ground.

3. The method of claim 1, wherein said providing comprises providing a settable bit including a third bit pad adapted to be in electrical communication with power.

4. The method of claim 1, wherein said providing comprises providing a settable bit including a first, a second, and a third bit pads that are electrically isolated from each other by linear gaps.

5. The method of claim 1, wherein said providing a settable bit comprises providing a first bit pad adapted to be in electrical communication with a voltage regulator circuit, the voltage regulator to provide a voltage value based at least in part on the electrical state of the one settable bit.

6. The method of claim 1, wherein said providing a settable bit comprises providing a first bit pad adapted to be in electrical communication with a frequency regulator circuit, the frequency regulator circuit to provide a Front Side Bus (FSB) frequency setting based at least in part on the electrical state of the one settable bit.

7. The method of claim 1, wherein said selectively setting the settable bit comprises depositing an electrically conductive material between the first and the second or third bit pads, the electrically conductive material including a material selected from the group consisting of lead-free solder, lead-free paste, solder comprising lead, and solder paste comprising lead.

8. An apparatus, comprising:
    a carrier substrate having a conductive trace; and
    a settable bit on the carrier substrate, the settable bit including at least a first, a second, and a third bit pads, the first bit pad adapted to be in electrical communication with a circuit device through the conductive trace, the second bit pad to provide a first electrical state, and the third bit pad to provide a second electrical state, the first, the second, and the third bit pads being electrically separated, the settable bit adapted to be selectively set to provide one of at least three electrical states to the circuit device, the selective setting to include either
        configuring the settable bit by depositing an electrically conductive material between the first and the second bit pads electrically coupling the first and second bit pads to provide the first electrical state,
        configuring the settable bit by depositing an electrically conductive material between the first and the third bit pads to provide the second electrical state, or
        configuring the settable bit by electrically isolating the first bit pad from the second and third bit pads to provide a third electrical state;
    wherein the first, the second, and the third bit pad are configured on the carrier substrate to form a disk shape; and
    wherein each of the first, the second, and the third bit pads being same type of bit pads of substantially equal-sized portions that when combined form a disk.

9. The apparatus of claim 8, wherein said settable bit including a second bit pad adapted to be in electrical communication with electrical ground.

10. The apparatus of claim 8, wherein said settable bit including a third bit pad adapted to be in electrical communication with power.

11. The apparatus of claim 8, wherein said settable bit includes a first, a second, and a third bit pads that are electrically isolated from each other by linear gaps.

12. The apparatus of claim 8, wherein said circuit device is a voltage regulator circuit, the voltage regulator to provide a voltage value based at least in part on the electrical state of the at least one settable bit.

13. The apparatus of claim 8, wherein said circuit device is a frequency regulator circuit, the frequency regulator circuit to provide a Front Side Bus (FSB) frequency setting based at least in part on the electrical state of the at least one settable bit.

* * * * *